United States Patent [19]
Kim et al.

[11] Patent Number: 5,177,486
[45] Date of Patent: * Jan. 5, 1993

[54] OPTICALLY ACTIVATED HYBRID PULSER WITH PATTERNED RADIATING ELEMENT

[75] Inventors: Anderson H. Kim, Toms River; Maurice Weiner, Ocean, both of N.J.; Louis J. Jasper, Jr., Fulton, Md.; Thomas E. Koscica, Clark; Robert J. Youmans, Brick, both of N.J.

[73] Assignee: The United States of America as represented by the Secretary of the Army, Washington, D.C.

[*] Notice: The portion of the term of this patent subsequent to Oct. 13, 2009 has been disclaimed.

[21] Appl. No.: 797,594

[22] Filed: Nov. 25, 1991

[51] Int. Cl.⁵ .................. G01S 7/282; H03K 3/53
[52] U.S. Cl. ......................... 342/21; 342/13; 342/175; 342/202; 250/214.1; 307/106
[58] Field of Search .................. 342/13, 21, 175, 368; 343/700 MS; 250/211 R, 211 J; 307/106

[56] References Cited

U.S. PATENT DOCUMENTS

| | | | |
|---|---|---|---|
| 3,757,290 | 9/1973 | Ross et al. | 342/457 X |
| 4,822,991 | 4/1989 | Riggs et al. | 250/211 J |
| 4,993,033 | 2/1991 | Lin | 372/30 |
| 5,028,971 | 7/1991 | Kim et al. | 357/30 |
| 5,047,621 | 9/1991 | Weiner et al. | 250/211 J X |

Primary Examiner—Gilberto Barron, Jr.
Attorney, Agent, or Firm—Michael Zelenka; William H. Anderson

[57] ABSTRACT

A high voltage sub-nanosecond pulser and radiator including a radial transmission line consisting of a dielectric member sandwiched between two patterned layers of metallization, one of which comprises a plurality of radiating elements. A photoconductive semiconductor gallium arsenide switch is embedded in the dielectric member which has a constant thickness. The other layer of metallization includes an apertured grid adjacent one surface of the switch for application of an energization pulse of laser light.

17 Claims, 2 Drawing Sheets

OPTICALLY ACTIVATED HYBRID PULSER WITH PATTERNED RADIATING ELEMENT

GOVERNMENT INTEREST

The invention described herein may be manufactured, used, and licensed by or for the Government for governmental purposes without the payment to me or us of any royalty thereon or therefor.

CROSS REFERENCE TO RELATED APPLICATION

This application is related to U.S. Ser. No. 07/797,595, entitled "Optically Activated Sub-Nanosecond Hybrid Pulser, which was filed in the name of Anderson H. Kim et al on Nov. 25, 1991, and which is assigned to the assignee of the present invention.

BACKGROUND OF THE INVENTION

1. FIELD OF THE INVENTION

This invention relates generally to RF signal generators and radiators therefor and more particularly to a sub-nanosecond, kilovolt pulse generator including a transmitting antenna integrated therewith for use in impulse radar apparatus, active electromagnetic signal jammers, and relatively high power microwave weapon systems.

2. DESCRIPTION OF THE PRIOR ART

Recently there has been much research activity into the generation and radiation of high power video pulses with sub-nanosecond risetimes. This stems from its ability to couple into and upset other electronic systems. Since the radiated power diminishes according to the inverse of square of distance between the radiating source and the target, a fast risetime is essential for the penetration of electronic systems having protective mechanisms. A high power, fast risetime RF source, combined with a wide bandwidth radiating element therefor becomes a much needed piece of equipment for future military systems such as active jammers and impulse radars.

In the above cross referenced related application, there is disclosed a sub-nanosecond pulse generator using a radial transmission line comprised of a photoconductive bulk GaAs switch centrally embedded in a circular dielectric disc of constant thickness with radial type layers of metallization formed on top and bottom surfaces thereof.

Since the characteristic impedance of such a device is inversely proportional to the width of the dielectric separating the top and bottom layers of metallization, the radial transmission line creates a non-uniform characteristic impedance primarily due to its geometrical configuration. Therefore, at a location outward from the center of the radial transmission line, the impedance is smaller compared to that at a closer in location. When the radial transmission line is charged and the photoconductive switch is optically activated, traveling waves begin to flow from the outer low impedance region to the inner high impedance region and in the process a voltage transformation occurs. Thus one of the advantages of this type of pulser is its property to produce voltage amplitude enhancement of the signal coupled to the load. Although this pulser can be connected to a conventional antenna via a waveguide, this invention contemplates integrating the antenna into the pulser itself.

SUMMARY

Accordingly, it is the principal object of the present invention to provide an improvement in the generation and radiation of relatively narrow pulsewidth high power pulses.

It is a further object of the present invention to provide an improvement in an optically activated sub-nanosecond kilovolt pulse generator and radiator which will improve efficiency and compactness while reducing cost.

It is another object of the invention to provide an integrated optically activated hybrid type pulse generator and antenna for the generation and radiation of sub-nanosecond video pulses which will reduce insertion loss and dispersion characteristics of the apparatus.

It is still another object of the invention to provide a sub-nanosecond pulse generator and radiator which will permit sequential firing of many like devices for enabling beam steering.

The foregoing and other objects of the invention are realized by forming a radiator consisting of a pattern of metallization on one side of a pulser and one comprised of a radial transmission of uniform thickness acting as an energy storage device coupled to an optically activated semiconductor switch of bulk GaAs.

BRIEF DESCRIPTION OF THE DRAWINGS

The following detailed description of the invention will be more readily understood when considered together with the accompanying drawings in which.

DETAILED DESCRIPTION OF THE INVENTION

Figure 1A:
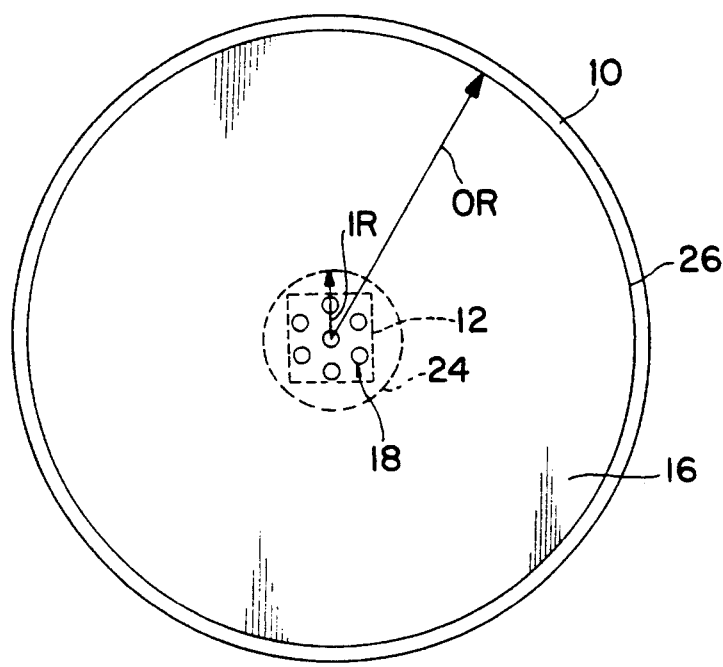
FIGS. 1A and 1B are top planar and central cross-sectional views, respectively, of a radial type optically activated hybrid pulser in accordance with the known prior art.
Figure 1B:
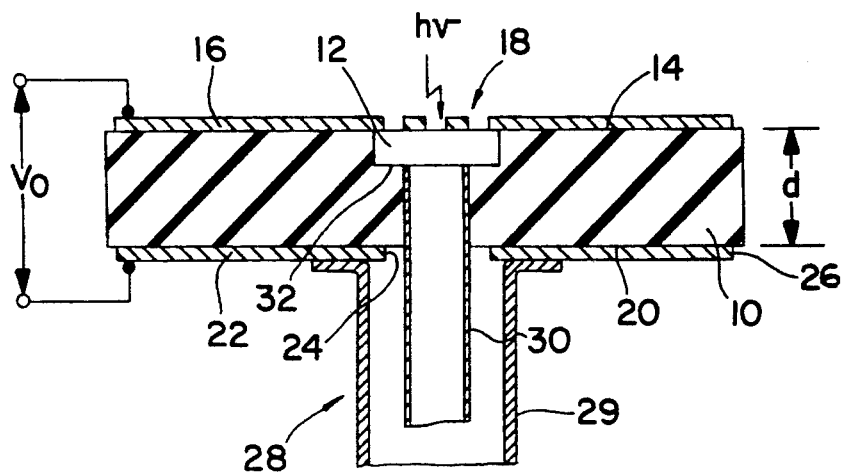

Referring now to FIGS. 1A and 1B, depicted thereat is a prior art device disclosed in the above-referenced related Kim et al application entitled "Optically Activated Sub-Nanosecond Hybrid Pulser" and which is specifically incorporated herein by reference. Shown thereat is a generally flat circular disc 10 of dielectric material of constant thickness. A photoconductive bulk semiconductor switch 12 is centrally embedded in the upper surface 14 as shown in FIG. 1B. The switch 12 comprises a semi-insulating gallium arsenide (GaAs) optically activated switch device. On the upper surface 14 of the dielectric member 10 there is formed a high voltage conducting plate member 16 comprising a layer of metallization which includes an apertured grid 18 (FIG. 1A) including a plurality of through-holes for coupling laser energy from an optical activating source, not shown, to the switch 14. The switch further comprises a bulk GaAs device which can be rendered conductive by laser light from a source, not shown, generating, for example, a 1.06 micron wavelength pulse. Such a light source typically comprises a neodymium doped yttrium aluminum garnet (Nd:YAG) laser. As shown, the laser light (hv) is introduced in the center portion of the semiconductor switch 12.

On the undersurface 20 of the dielectric disc 10 is formed a second high voltage conducting plate member 22, also comprised of a layer of metallization. The plate of metallization 22 opposes the top layer of metallization 16 and is annular in configuration, being defined by the inner and outer edges 24 and 26 and having an inside diameter IR and an outside diameter OR.

A coaxial output transmission line 28 is connected to the device and is comprised of an outer conductor 29 and a inner conductor 30. The outer conductor 28 is secured to the bottom metallization layer 22, while the inner conductor is shown passing through the underside 20 of the dielectric member 10 to the lower surface 32 of the semiconductor switch 12. When laser light is introduced to the semiconductor switch 12 through the grided aperture 18, photon generated carriers in the bulk semiconductor material reduces the resistivity of the switch so that the inner conductor 30 is electrically connected to the top metallization plate 16. When this occurs, electrical energy stored in the capacitor defined by the dielectric member 10 and the two conducting layers of metallization 16 and 22 upon the application of a charging voltage $V_o$ is delivered to the inner conductor 30 of the coaxial output line 28 in the form of traveling waves.

For a uniform thickness of the radial transmission line and more particularly the thickness (d) of the dielectric member 10, the degree of characteristic impedance variation is determined by the ratio between the inner radius IR and the outer radius OR of the transmission line as defined by the dimensions of the lower metallization layer 22. In such a configuration, the voltage output $V_{out}$ from the coaxial cable 28 can be expressed as:

$$V_{out} = [(V_o \times Z_o)/(Z_{IR} + Z_o + R_s)][Z_{IR}/Z_{OR}]^{\frac{1}{2}} \quad (1)$$

$Z_o$ is the load impedance of a load connected to the coaxial line 28, $Z_{IR}$ and $Z_{OR}$ is the characteristic impedance at the inner and outer edges 24 and 26 of the transmission line, $R_s$ is the equivalent resistance of the semiconductor switch 12, and $V_o$ is the bias voltage applied for charging the capacitance formed by the dielectric member 10 and the metallization layers 16 and 22. The square root term expresses the voltage transformation property as the wave proceeds toward the center of the radial line to the coaxial cable 28.

Figure 2:
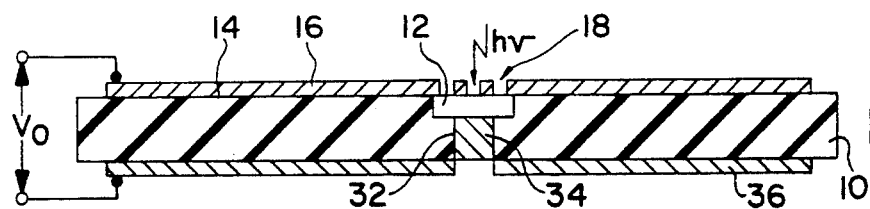
FIG. 2 is a central cross sectional view illustrative of the preferred embodiment of the subject invention.
Figure 3:
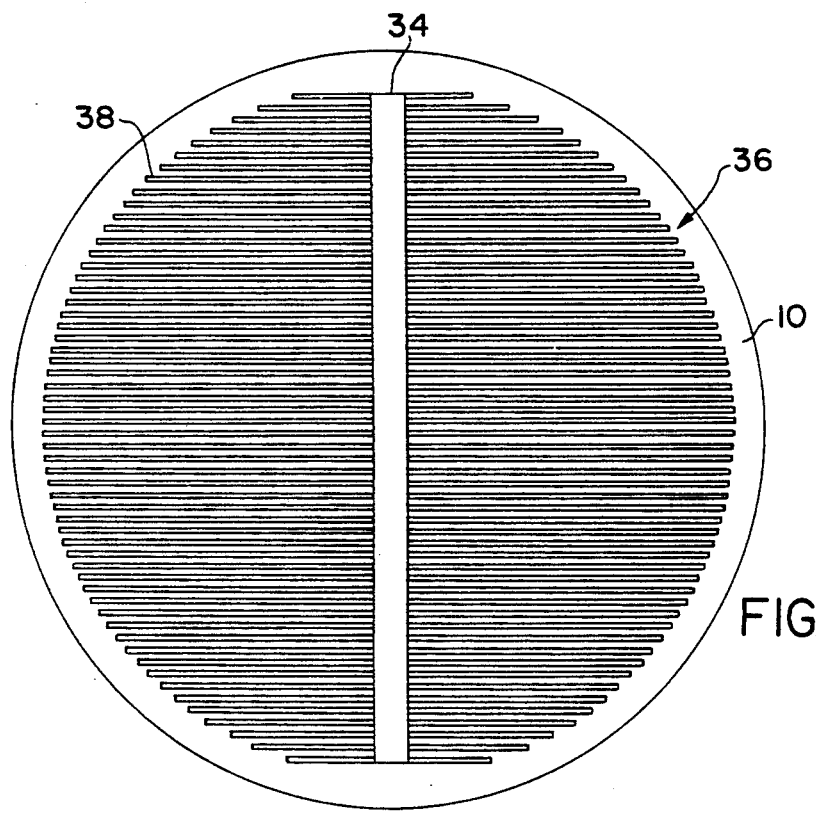
FIG. 3 is a bottom planar view of the pattern of metallization formed in the bottom of the embodiment shown in FIG. 2 for operating as a radiating antenna.

Referring now to the preferred embodiment of the invention which is depicted in FIGS. 2 and 3, shown thereat is a hybrid pulser similar to that shown in FIGS. 1A and 1B, with the exception that a radiator structure in the form of a metallized pattern implementing a transmitting antenna is directly attached to one side of a radial pulser structure.

As shown, a generally circular disc of dielectric material of constant thickness 10 has a bulk GaAs photoconductive switch device 12 embedded at the center of its upper surface 14 as before. Also, a top layer of metallization 16 including an apertured grid of throughholes 18 is applied to the surface 14 and in all other respects is identical to the configuration shown in FIG. 1A. The dielectric layer 10 is comprised of material such as polytetrafluoroethylene, commonly known as TEFLON ®. The channel 32 through which the inner conductor 30 (FIG. 1B) passes is now filled with metallization 34 so that a conducting channel is implemented thereby. This is followed by the fabrication of a pattern of metallization 36 comprised of a plurality of conducting striplines 38 which extend outwardly from the channel o metallization 34 as shown in FIG. 3. The dimensions of the thickness of the dielectric member 10 and the inner and outer dimensions of the antenna pattern 36 determine the characteristic of the radial transmission line and the degree of voltage enhancement provided at the load, which in this instance comprises the radiating antenna structure defined by the size and shape of the conducting striplines 38.

While a configuration consisting of a plurality of mutually parallel striplines 38 of equal width and unequaled length are shown in FIG. 3, several other types of antenna configurations are possible and depend upon the type of polarization desired, as well as the efficiency, gain, narrow band vs. wide band frequency output, and directionality required. Therefore, many options are available. If the polarization of the target electronic system is known, then the same polarization mode will be implemented by the metallization pattern 36 so that it provides a high concentration of energy which is matched to the target. For a jammer application, however, the required polarization for maximum effect may not readily be known and it is therefore necessary to spread the energy along more than one polarization axis. For impulse radars, wide frequency spectrum components are essential to detect and identify objects made with Stealth technology. For directed energy weapon (DEW) applications, directivity, efficiency and gain are extremely important antenna properties which are needed to concentrate maximum energy on the target.

Since the patterned antenna 36 attached to the radial structure shown in FIG. 2 consists of a parallel set of resonators 38 charged with energy, the choice of resonator size and number affects the frequency distribution. The directionality of the output beam is then essentially determined by the aperture of the antenna.

The configuration shown in FIG. 3 is illustrative of a wide band antenna. Upon the application of a charging voltage $V_o$ across elements 16 and 36 and a triggering of the semiconductor switch 12 by laser light applied through the grided aperture 18, video pulses consisting of a wide range of RF frequency components are generated by the discharge of energy accumulated in the dielectric 10 and which are coupled to the radiating elements 38.

Figure 4:
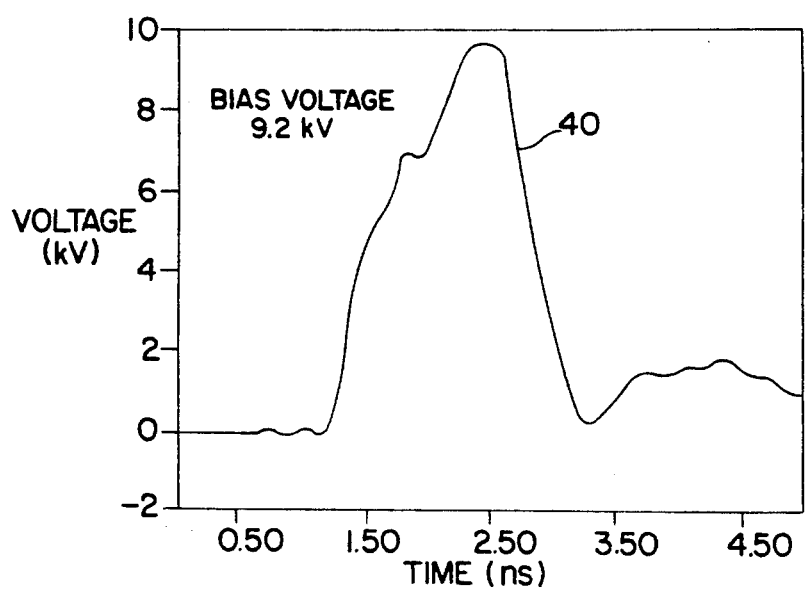
FIG. 4 is a characteristic curve illustrative of a pulse generated by the embodiment of the invention shown in FIG. 2.

By integrating the antenna pattern directly onto the dielectric disc 10 of the radial transmission line and coupling the pulsed RF source into the metallized pattern making up the antenna, an overall compactness is achieved. With the hybrid pulser as shown being triggered by laser light, the jitter in the optically activated GaAs switch 12, may be decreased to less than 100 picoseconds. For a voltage $V_o$ of, for example, 9.2 Kv being applied, a video pulse as shown by reference numeral 40 in FIG. 4 will be generated.

By using an array of devices in accordance with this invention, sequential firing can be implemented for beam steering a composite beam of radiation. With this technique, extremely high amplitude RF signals may be generated. Accordingly, an integrated structure of RF generator and antenna as shown and described herein, will not only reduce the dispersion characteristics of the system, but also reduce insertion loss while providing a compact package of components.

Having thus shown and described what is at present considered to be the preferred embodiment of the invention, it should be noted that the same has been made by way of illustration and not limitation. Accordingly, all modifications, alterations and changes coming within the spirit and scope of the invention a defined in the appended claims are herein meant to be included.

What is claimed is:

1. An integrated nanosecond signal generator and radiator apparatus comprising:
    an electrical energy storage device coupled to a source of electrical voltage and including a transmission line comprised of a dielectric member sandwiched between upper and lower radial type electrical conductors which are disposed parallel to each other;
    a photoconductive semiconductor switch coupled to said energy storage element and centrally located beneath said upper conductor, said switch becoming conductive upon the application of a predetermined type of light energy so as to cause a high amplitude, narrow output video pulse of nanosecond pulse width dimensions to be generated at the radial center of said upper and lower radial type conductors, and
    wherein one of said radial type conductors further comprises antenna mans for radiating the RF energy of the generated video pulse, and
    wherein said upper conductor includes aperture means thereon for the application of light energy to said switch.

2. The apparatus according to claim 1 wherein said antenna means comprises a pattern of metallization.

3. An integrated nanosecond signal generator and radiator apparatus comprising:
    an electrical energy storage device coupled to a source of electrical voltage and including a transmission line comprised of a dielectric member sandwiched between upper and lower radial type electrical conductors which are disposed parallel to each other, one of said radial type conductors further comprising an antenna means for radiating the RF energy of the generated video pulse, said antenna means having a pattern of metallization which has a plurality of stripline antenna element;
    a photoconductive semiconductor switch coupled to said energy storage element and centrally located beneath said upper conductor, said switch becoming conductive upon the application of a predetermined type of light energy so as to cause a high amplitude, narrow output video pulse of nanosecond pulsewidth dimensions to be generated at the radial center of said upper and lower radial type conductors, and
    wherein said upper radial type conductor includes aperture means thereon for the application of light energy to said switch.

4. The apparatus according to claim 2 wherein said pattern of metallization comprises a set of mutually parallel stripline antenna elements.

5. The apparatus according to claim 3 wherein said one conductor comprises the lower conductor.

6. The pulse signal generator according to claim 1 wherein antenna means comprise said lower conductor and wherein said switch comprises a semiconductor switch centrally located beneath said upper conductor and wherein said upper conductor includes aperture means thereat for the application of light energy to said switch.

7. The apparatus according to claim 6 and additionally including means for electrically connecting said antenna means to said semiconductor switch.

8. The apparatus according to claim 7 wherein said means for connecting comprises a region of metallization passing through said dielectric member to said semiconductor switch.

9. The apparatus according to claim 8 wherein said photoconductive semiconductor switch comprises a bulk semiconductor switch device embedded in said dielectric medium.

10. The apparatus according to claim 9 wherein said semiconductor switch device is comprised of GaAs.

11. The apparatus according to claim 9 wherein said upper conductor comprises a generally continuous layer of metallization.

12. The apparatus according to claim 11 wherein said continuous layer of metallization comprises a circular pattern of metallization.

13. The pulse signal generator according to claim 12 wherein said circular pattern of metallization includes a set of light apertures at the center for the application of energizing light to said semiconductor switch device.

14. The pulse signal generator according to claim 13 wherein said antenna means comprises a pattern of metallization including a plurality of stripline segments.

15. The pulse signal generator according to claim 14 wherein said plurality of stripline segments comprise a set of linear stripline segments.

16. The apparatus according to claim 15 wherein said set of linear stripline segments are commonly connected to said region of metallization passing through said dielectric member to said semiconductor switch.

17. The apparatus according to claim 16 wherein said stripline segments are mutually parallel.

* * * * *